(12) United States Patent
Ariji et al.

(10) Patent No.: US 11,218,131 B2
(45) Date of Patent: Jan. 4, 2022

(54) CRYSTAL UNIT

(71) Applicant: NIHON DEMPA KOGYO CO., LTD., Tokyo (JP)

(72) Inventors: Takumi Ariji, Saitama (JP); Akihiro Sakanashi, Saitama (JP); Takashi Asamizu, Saitama (JP); Yoshihiro Takaki, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 434 days.

(21) Appl. No.: 16/231,952

(22) Filed: Dec. 25, 2018

(65) Prior Publication Data
US 2019/0199318 A1    Jun. 27, 2019

(30) Foreign Application Priority Data

Dec. 27, 2017   (JP) .............................. JP2017-251224
Mar. 7, 2018    (JP) .............................. JP2018-040579

(51) Int. Cl.
*H03H 9/05*       (2006.01)
*H03H 9/02*       (2006.01)
(Continued)

(52) U.S. Cl.
CPC ...... *H03H 9/0557* (2013.01); *H03H 9/02023* (2013.01); *H03H 9/02102* (2013.01);
(Continued)

(58) Field of Classification Search
CPC .... H03H 9/10; H03H 9/02102; H03H 9/1021; H03H 9/0519; H03H 9/19;
(Continued)

(56) References Cited

U.S. PATENT DOCUMENTS 8,754,718 B2   6/2014  Horie
9,054,604 B2   6/2015  Horie
(Continued)

FOREIGN PATENT DOCUMENTS

CN   204304951     4/2015
JP   2008205938    9/2008
(Continued)

OTHER PUBLICATIONS

Office Action of Japan Counterpart Application, with English translation thereof, dated Dec. 31, 2020, pp. 1-15.
(Continued)

*Primary Examiner* — Arnold M Kinkead
(74) *Attorney, Agent, or Firm* — JCIPRNET

(57) ABSTRACT

A single-chamber-type temperature-sensor-provided crystal unit includes: a single chamber; and a quartz-crystal vibrating piece and a temperature sensor, provided in the single chamber. The quartz-crystal vibrating piece has a square planar shape. The quartz-crystal vibrating piece is secured in the single chamber at two securing portions via conductive members. The two securing portions are in proximities of both ends of a first side of the quartz-crystal vibrating piece. The temperature sensor has a rectangular parallelepiped shape. The temperature sensor is disposed such that a longitudinal surface of the temperature sensor is parallel to a line segment Y and the temperature sensor is close to a side of the two securing portions within the single chamber, when a line segment connecting the two securing portions is defined as the line segment Y.

8 Claims, 11 Drawing Sheets

(51) Int. Cl.
  *H03H 9/19* (2006.01)
  *H03H 9/10* (2006.01)
  *H03L 1/04* (2006.01)
  *H03H 9/13* (2006.01)

(52) U.S. Cl.
  CPC ........ *H03H 9/0519* (2013.01); *H03H 9/0547* (2013.01); *H03H 9/0552* (2013.01); *H03H 9/10* (2013.01); *H03H 9/1021* (2013.01); *H03H 9/13* (2013.01); *H03H 9/19* (2013.01); *H03L 1/04* (2013.01)

(58) Field of Classification Search
  CPC ............. H03H 9/02023; H03H 9/0552; H03H 9/0547; H03H 9/0557; H03H 9/13; H03L 1/04
  USPC .................................. 331/158, 176; 310/315
  See application file for complete search history.

(56) References Cited

U.S. PATENT DOCUMENTS

| | | | |
|---|---|---|---|
| 9,160,254 | B2 | 10/2015 | Horie |
| 9,577,574 | B2 | 2/2017 | Komine et al. |
| 9,685,889 | B2 | 6/2017 | Horie |
| 10,715,058 | B2 | 7/2020 | Horie |
| 2012/0229225 | A1 | 9/2012 | Horie |
| 2013/0257555 | A1 | 10/2013 | Horie |
| 2014/0125420 | A1 | 5/2014 | Horie |
| 2014/0239773 | A1 | 8/2014 | Horie |
| 2015/0381184 | A1* | 12/2015 | Suzuki ............. H03B 5/32 331/156 |
| 2017/0264214 | A1 | 9/2017 | Horie |

FOREIGN PATENT DOCUMENTS

| | | |
|---|---|---|
| JP | 2013055573 | 3/2013 |
| JP | 2013146004 | 7/2013 |
| JP | 2014160886 | 9/2014 |
| JP | 2015154410 | 8/2015 |
| JP | 2015170950 | 9/2015 |
| JP | 2015226152 | 12/2015 |
| JP | 2016010099 | 1/2016 |
| JP | 5866973 | 2/2016 |
| JP | 2016086324 | 5/2016 |
| JP | 6137255 | 5/2017 |
| JP | 2019068289 | 4/2019 |
| TW | I521860 | 2/2016 |
| TW | 201740681 | 11/2017 |

OTHER PUBLICATIONS

"Office Action of Japan Counterpart Application" with English translation thereof, dated Aug. 17, 2021, p. 1-p. 18.
Office Action of Taiwan Counterpart Application, with English translation thereof, dated Aug. 31, 2021, pp. 1-11.

* cited by examiner

CRYSTAL UNIT

CROSS-REFERENCE TO RELATED APPLICATIONS

This application is based on and claims priority under 35 U.S.C. § 119 to Japanese Patent Application No. 2017-251224, filed on December 27, and Japanese Patent Application No. 2018-040579, filed on Mar. 7, 2018, and the entire content of which is incorporated herein by reference.

TECHNICAL FIELD

This disclosure relates to a crystal unit with a temperature sensor.

DESCRIPTION OF THE RELATED ART

A crystal unit with a structure where a quartz-crystal vibrating piece and a temperature sensor are housed in a single chamber is referred to as a single-chamber-type temperature-sensor-provided crystal unit. A crystal unit with what is called an H-shaped structure where a first chamber housing a crystal element and a second chamber housing a temperature sensor are stacked is referred to as an H-shaped-structure temperature-sensor-provided crystal unit.

An exemplary single-chamber-type temperature-sensor-provided crystal unit is disclosed in, for example, Japanese Unexamined Patent Application Publication No. 2008-205938 and Japanese Unexamined Patent Application Publication No. 2015-226152.

A single-chamber-type temperature-sensor-provided crystal unit disclosed in Japanese Unexamined Patent Application Publication No. 2008-205938 includes a quartz-crystal vibrating piece cantilevered in a ceramic container. A temperature sensor is mounted in the container with the following two types of structures. In a first structure, the temperature sensor is mounted on a bottom surface inside the ceramic container and a position below a center of the quartz-crystal vibrating piece (FIG. 2 in Japanese Unexamined Patent Application Publication No. 2008-205938). In a second structure, the temperature sensor is mounted on the bottom surface inside the ceramic container and a position slightly apart from a distal end of the quartz-crystal vibrating piece mounted in the container (FIG. 1 in Japanese Unexamined Patent Application Publication No. 2008-205938).

A single-chamber-type temperature-sensor-provided crystal unit disclosed in Japanese Unexamined Patent Application Publication No. 2015-226152 includes a quartz-crystal vibrating piece cantilevered in a ceramic container. Furthermore, a temperature sensor is mounted in the container in a state where one end portion of the temperature sensor is positioned between two support pads disposed for the cantilevering in the container (FIG. 1 in Japanese Unexamined Patent Application Publication No. 2015-226152).

Meanwhile, an exemplary H-shaped-structure temperature-sensor-provided crystal unit is disclosed in, for example, Japanese Unexamined Patent Application Publication No. 2016-10099. In this crystal unit, a quartz-crystal vibrating piece is cantilevered in a first chamber. A second chamber is stacked under the first chamber. Actually, the second chamber has an open lower side and has a depressed portion having a square planar shape, and a temperature sensor having a rectangular parallelepiped shape is mounted inside the depressed portion. Specifically, the temperature sensor in the rectangular parallelepiped shape is mounted at the center inside the depressed portion in both cases of a case where a long side of the temperature sensor is parallel to a first side of the depressed portion (FIG. 1C in Japanese Unexamined Patent Application Publication No. 2016-10099) or a case where a short side of the temperature sensor is parallel to the first side of the depressed portion (FIG. 3C in Japanese Unexamined Patent Application Publication No. 2016-10099).

A temperature-sensor-provided crystal unit is desired to further improve temperature compensation accuracy. As one method for achieving this, a method where both a quartz-crystal vibrating piece and a temperature sensor are disposed so as to react to an environmental temperature at an identical temperature as much as possible. This is because smaller temperature difference between both can reduce a temperature compensation error.

In this respect, in the structure disclosed in Japanese Unexamined Patent Application Publication No. 2015-226152, heat conduction conditions of the temperature sensor and the quartz-crystal vibrating piece are relatively identical because the temperature sensor is disposed near the support position of the quartz-crystal vibrating piece, thus it is considered that the temperature difference between both can be decreased. However, in the structure disclosed in Japanese Unexamined Patent Application Publication No. 2015-226152, a clearance between the two support pads is actually narrow, and when a dimensional margin to avoid a contact of a conductive adhesive, which secures the quartz-crystal vibrating piece inside the container, to the temperature sensor is considered, the above-described clearance is more and more narrowed, thus it is considerably difficult and not realistic to mount the temperature sensor to this clearance.

Japanese Unexamined Patent Application Publication No. 2016-10099 discloses the exemplary H-shaped-structure temperature-sensor-provided crystal unit where the temperature sensor is disposed in the depressed portion such that the short side of the temperature sensor in the rectangular parallelepiped shape becomes parallel to the first side of the depressed portion as a chamber for the temperature sensor, or such that the long side becomes parallel. However, the technique disclosed in Japanese Unexamined Patent Application Publication No. 2016-10099 is a technique in consideration of an influence of a curvature of the container (paragraph 51 in Japanese Unexamined Patent Application Publication No. 2016-10099), but not a technique in consideration of decrease of the temperature difference between a crystal element and the temperature sensor.

A need thus exists for a crystal unit which is not susceptible to the drawback mentioned above.

SUMMARY

According to an aspect of this disclosure, there is provided a crystal unit, which is a single-chamber-type temperature-sensor-provided crystal unit, and includes: a single chamber; and a quartz-crystal vibrating piece and a temperature sensor, provided in the single chamber. The quartz-crystal vibrating piece has a square planar shape. The quartz-crystal vibrating piece is secured in the single chamber at two securing portions via conductive members. The two securing portions are in proximities of both ends of a first side of the quartz-crystal vibrating piece. The temperature sensor has a rectangular parallelepiped shape. The temperature sensor is disposed such that a longitudinal surface of the temperature sensor is parallel to a line segment Y and the temperature sensor is close to a side of the two securing portions within the single chamber, when a line segment connecting the two securing portions is defined as the line segment Y.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
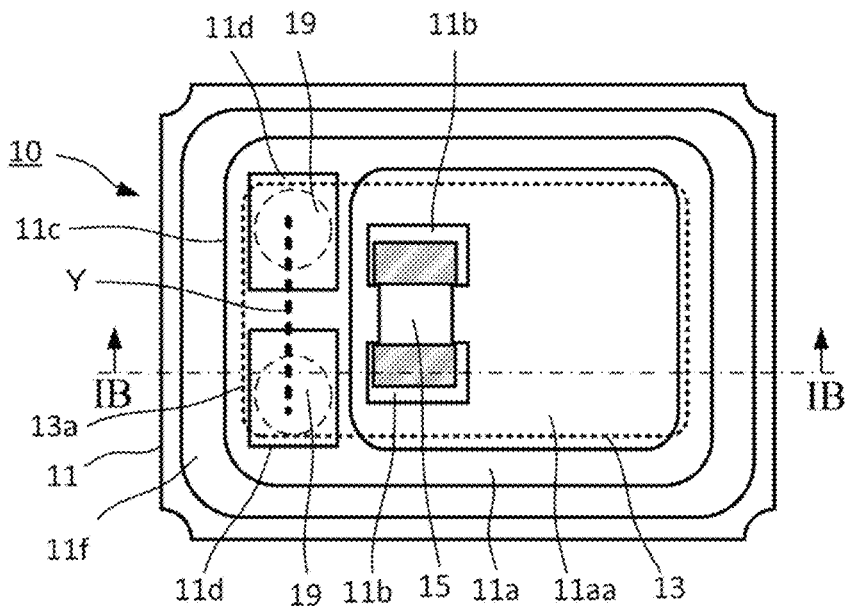
FIG. 1A, FIG. 1B, and FIG. 1C are explanatory drawings of Working Example 1.

The following describes respective crystal units of a first aspect and a second aspect of this disclosure with reference to the drawings. Each drawing used in the descriptions is merely illustrated schematically for understanding the disclosure. In each drawing used in the descriptions, like reference numerals designate corresponding or identical elements, and therefore such elements will not be further elaborated in some cases. Structural examples, used members, and a similar factor described in the following embodiments are merely preferable examples within the scope of the disclosure. Therefore, the disclosure is not limited to only the following embodiments.

1. CONFIGURATION OF ASPECTS 1-1. Embodiment of First Aspect

Figure 1B:
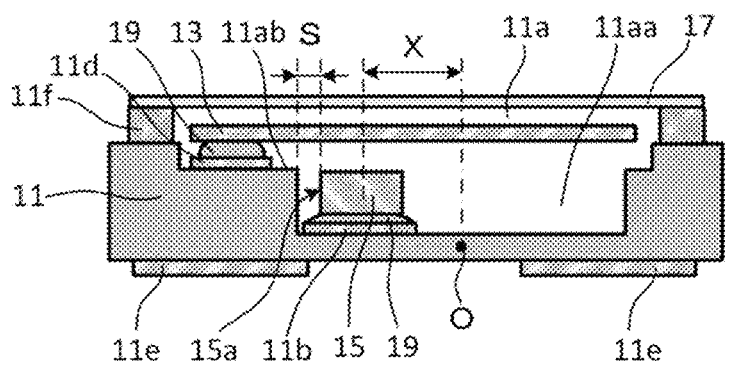
Figure 1C:
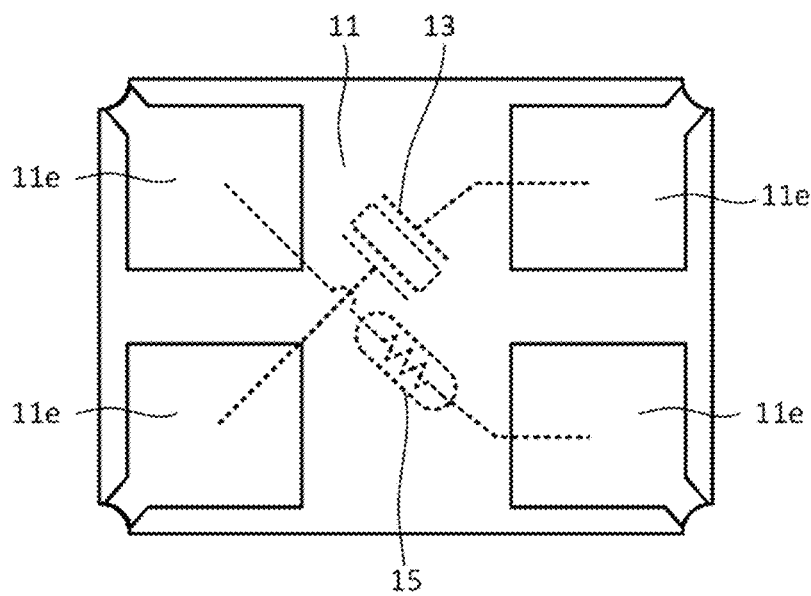

FIG. 1A to FIG. 1C are drawings describing a single-chamber-type temperature-sensor-provided crystal unit 10 (hereinafter referred to as a crystal unit 10 for short in some cases) as an embodiment of a first aspect. Especially, FIG. 1A is a top view of the crystal unit 10, FIG. 1B is a sectional drawing taken along a line IB-IB in FIG. 1A, and FIG. 1C is a bottom view. Note that, FIG. 1A illustrates a state where a lid member 17 is removed.

This crystal unit 10 includes a container 11 that has at least one chamber 11a, a quartz-crystal vibrating piece 13 and a temperature sensor 15 that are mounted inside the chamber 11a, and the lid member 17 that seals the chamber 11a of the container 11.

In this case, the container 11 is formed of a ceramic package having a square planar shape, specifically, a rectangular planar shape. The chamber 11a is formed to have a square planar shape, specifically, a rectangular planar shape as well. Furthermore, this chamber 11a has a depressed portion 11aa for housing the temperature sensor 15. Then, the depressed portion 11aa has a bottom surface on which pads 11b are disposed, and the temperature sensor 15 is mounted to the pads 11b.

Furthermore, the container 11 includes a step portion 11ab on a peripheral area of the depressed portion 11aa. This container 11 further includes support pads 11d for cantilevering the quartz-crystal vibrating piece 13 on a part of this step portion 11ab and on respective portions close to both ends of a first side 11c of the chamber 11a (one short side 11c of the chamber 11a) on this first side 11c side.

Furthermore, the container 11 includes external connecting terminals (which is also referred to as "external terminal") 11e at respective four corners on an outer side of a bottom surface of the container 11. These four external terminals 11e are connected to corresponding pads 11b and support pads 11d by via-wirings (not illustrated). FIG. 1C illustrates an exemplary connection of the external terminals 11e to the quartz-crystal vibrating piece 13 and the temperature sensor 15. That is, one pair of the external terminals 11e on diagonal corners among the four external terminals 11e are disposed as terminals for the quartz-crystal vibrating piece 13, and another pair of the external terminals 11e are disposed as terminals for the temperature sensor 15.

Furthermore, in this case, the container 11 includes a ring 11f for a seam welding on a dike surrounding the chamber 11a.

The quartz-crystal vibrating piece 13 is, for example, an AT-cut quartz-crystal vibrating piece having a square planar shape, in detail, a rectangular planar shape. This quartz-crystal vibrating piece 13 includes excitation electrodes (not illustrated) on respective both principal surfaces, and further includes extraction electrodes (not illustrated) extracted from the excitation electrodes to the first side 13a side of the quartz-crystal vibrating piece 13.

The temperature sensor 15 is, in this case, a rectangular parallelepiped thermistor having a well-known chip component shape. The temperature sensor 15 is mounted to the above-described pads 11b with a conductive member 19. The quartz-crystal vibrating piece 13 is connected and secured to the support pads 11d of the container 11 near both ends of a first side 13a (a short side 13a) of the quartz-crystal vibrating piece 13 and at positions of the extraction electrodes (not illustrated) with the conductive member 19. Therefore, the quartz-crystal vibrating piece 13 is cantilevered in the chamber 11a of the container 11 while covering the temperature sensor 15 upward the temperature sensor 15.

Thus, the container 11 where the quartz-crystal vibrating piece 13 and the temperature sensor 15 are mounted in the common chamber 11a are sealed by the lid member 17 in a state where, for example, a vacuum atmosphere or a nitrogen atmosphere is created inside the chamber 11a.

In this crystal unit 10, the temperature sensor 15 is disposed as follows. That is, the temperature sensor 15 is disposed in the chamber 11a of the container 11 such that a longitudinal surface 15a of the rectangular parallelepiped temperature sensor 15 (see FIG. 1B) is parallel to a line segment Y (see FIG. 1A) connecting the support pads 11d as two securing portions that cantilever the quartz-crystal vibrating piece 13, and the temperature sensor 15 is close to the support pads 11d, as the two securing portions side, within the chamber 11a.

More specifically, the temperature sensor 15 is disposed in the depressed portion 11aa so as to be close to the support pad 11d side by a dimension X with respect to a midpoint O (see FIG. 1B) of a dimension of the depressed portion 11aa in a direction perpendicular to the line segment Y within the depressed portion 11aa of the chamber 11a. In other words, the temperature sensor 15 is disposed to be approached to the support pad 11d side such that a distance S between an edge of the depressed portion 11aa on the support pad 11d side and an edge of the temperature sensor 15 on the support pad 11d side has a predetermined dimension in the depressed portion 11aa.

Here, for providing an effect of this disclosure, the distance S is preferred to be a small value as much as possible, and according to an experiment by inventors, for example, the distance S is preferred to be equal to or less than a width dimension of the temperature sensor 15, preferably equal to or less than 75% of the width dimension of the temperature sensor 15, further preferably equal to or less than 50% of the width dimension of the temperature sensor 15. Thus configured distance S causes a heat from the securing portion side to be easily transferred to the temperature sensor.

The temperature sensor 15 disposed in the chamber 11a of the container 11 as described above can decrease a temperature difference between the quartz-crystal vibrating piece 13 and the temperature sensor 15 when the heat reaches from an external heat source to the crystal unit 10 compared with the temperature sensor 15 disposed in other manners (details will be described below).

1-2. Embodiment of Second Aspect

Figure 2A:
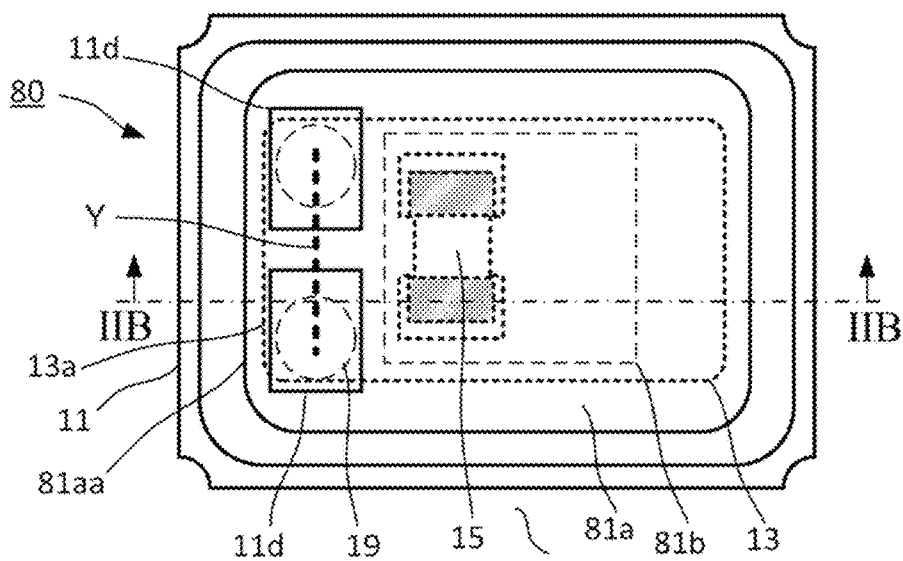
FIG. 2A, FIG. 2B and FIG. 2C are explanatory drawings of Working Example 2.
Figure 2B:
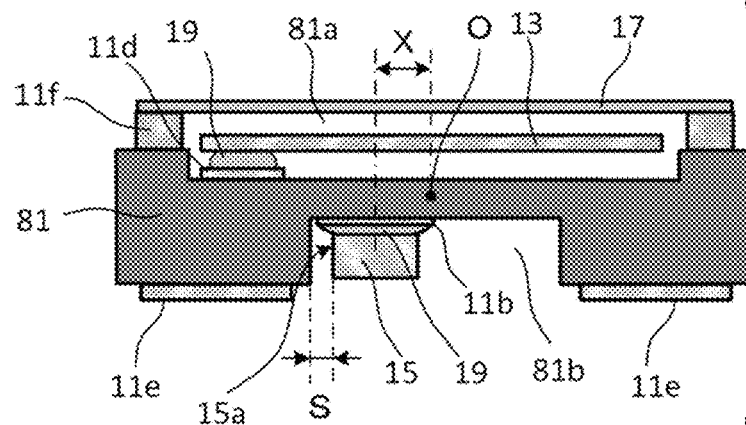
Figure 2C:
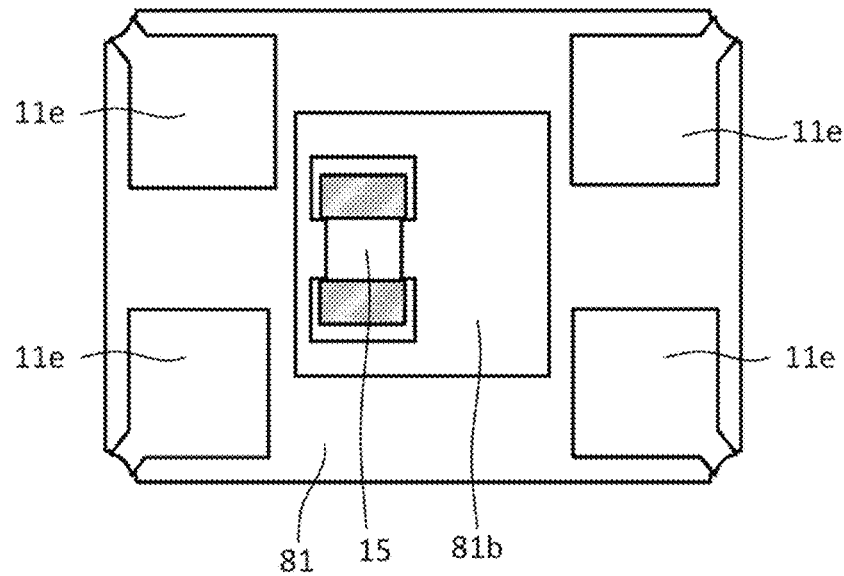

Next, a description will be given of an H-shaped-structure temperature-sensor-provided crystal unit 80 (hereinafter referred to as a crystal unit 80 for short in some cases) as an embodiment of a second aspect of this disclosure. FIG. 2A to FIG. 2C are explanatory drawings of the crystal unit 80. Especially, FIG. 2A is a top view of the crystal unit 80, FIG. 2B is a sectional drawing taken along a line IIB-IIB in FIG. 2A, and FIG. 2C is a bottom view. Note that, FIG. 2A illustrates a state where a lid member 17 is removed.

A difference between this crystal unit 80 and the crystal unit 10 arises in that the crystal unit 80 includes a container with an H-shaped structure as a container 81 and a temperature sensor 15 is mounted in the container 81 in a specific arrangement. The following describes details.

First, in the crystal unit 80, the container 81 is a container with the H-shaped structure including a first chamber 81a that houses a quartz-crystal vibrating piece 13 and a second chamber 81b that is stacked over the first chamber 81a and houses the temperature sensor 15. Note that, "stacked" means that the first chamber 81a and the second chamber 81b are positioned above and below, and includes a case where two chambers are integrally formed without a boundary between stacked layers.

Furthermore, in the case of this embodiment, the second chamber 81b is a chamber in a shape of a depressed portion where a lower surface side of the container 81 opens. Then, the container 81 includes pads 11b for mounting the temperature sensor 15 on positions close to the above-described line segment Y side on a bottom surface of the second chamber 81b. This container 81 further includes external connecting terminals 11e at respective four corners of the container 81 on a peripheral area of the second chamber 81b.

Similarly to the first aspect, one pair of the external terminals 11e on diagonal corners among the four external terminals 11e are disposed as terminals for the quartz-crystal vibrating piece 13, and another pair of the external terminals 11e are disposed as terminals for the temperature sensor 15. Furthermore, in this case, the container 81 includes a ring 11f for a seam welding on a dike surrounding the first chamber 81a. This container 81 can be formed of, for example, a ceramic package.

Similarly to the first aspect, the quartz-crystal vibrating piece 13 has a square planar shape. This quartz-crystal vibrating piece 13 is secured in the first chamber at two positions near both ends of a first side 13a (one short side 13a) of the quartz-crystal vibrating piece 13 via conductive members. Specifically, the quartz-crystal vibrating piece 13 is connected and secured to the support pads 11d disposed near respective both ends of a first side 81aa on the first side 81aa side in the first chamber 81a with the conductive member 19.

The temperature sensor 15 has a rectangular parallelepiped shape, and is mounted in the second chamber 81b of the container 81 as follows. That is, when a line segment connecting the above-described two securing portions of the quartz-crystal vibrating piece 13 is defined as a line segment Y (see FIG. 2A), the temperature sensor 15 is disposed such that its longitudinal surface 15a (see FIG. 2B) is parallel to the line segment Y, and the temperature sensor 15 is close to the two securing portions side of the first chamber 81a within the second chamber 81b.

More specifically, the temperature sensor 15 is disposed in the second chamber 81b so as to be close to the support pad 11d side by a dimension X with respect to a midpoint O (see FIG. 2B) of a dimension of the second chamber 81b in a direction perpendicular to the line segment Y within the second chamber 81b. In other words, the temperature sensor 15 is disposed to be approached to the support pad 11d side such that a distance S between an edge of the second chamber 81b on the support pad 11d side and an edge of the temperature sensor 15 on the support pad 11d side has a predetermined dimension in the second chamber 81b.

Here, for providing an effect of this disclosure, the distance S is preferred to be a small value as much as possible, and according to an experiment by inventors, for example, the distance S is preferred to be equal to or less than a width dimension of the temperature sensor 15, preferably equal to or less than 75% of the width dimension of the temperature sensor 15, further preferably equal to or less than 50% of the width dimension of the temperature sensor 15. Thus configured distance S causes a heat from the securing portion side to be easily transferred to the temperature sensor.

The temperature sensor 15 disposed in the second chamber 81b of the container 81 as described above can decrease a temperature difference between the quartz-crystal vibrating piece 13 and the temperature sensor 15 when the heat reaches from an external heat source to the crystal unit 80 compared with the temperature sensor 15 disposed in other manners. This respect will be described with simulation results below.

2. Description on Effect with Simulation

Simulations below were performed to confirm effects of the above-described embodiments. As simulation models, a model for a finite element method on the crystal unit 10 described using FIG. 1A to FIG. 1C (Working Example 1), a model for the finite element method on the crystal unit 80 described using FIG. 2A to FIG. 2C (Working Example 2), and models 30, 40, 50, and 60 (respectively corresponding to crystal units 30, 40, 50, 60) for the finite element method as Comparative Example 1, Comparative Example 2, Comparative Example 3, and Comparative Example 4, which are described below by referring to FIG. 3 to FIG. 6, were prepared. In FIG. 3 to FIG. 6, while reference numerals similar to FIG. 1A to FIG. 1C designate elements corresponding or identical to those in FIG. 1A to FIG. 1C, reference numerals attached to elements not necessary for the explanation are omitted.

Figure 3:
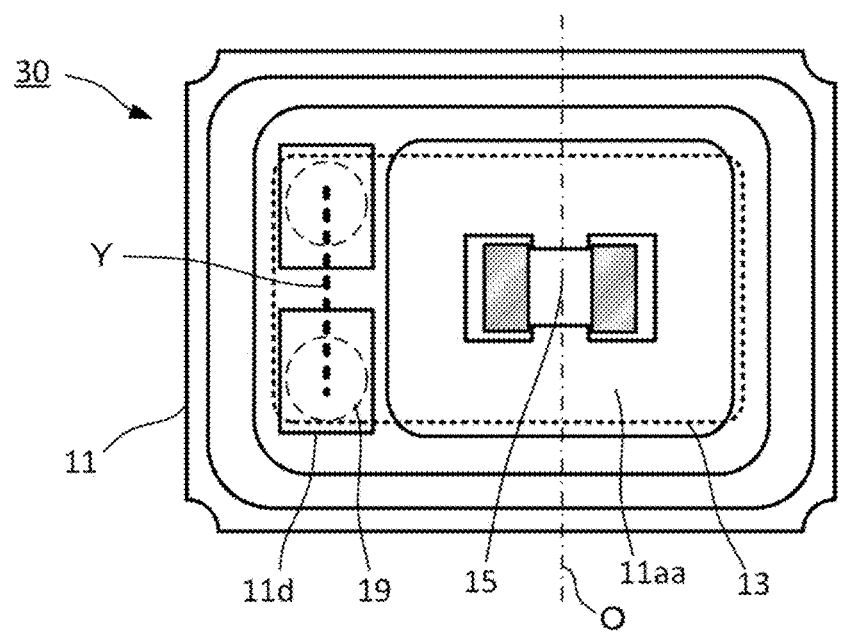
FIG. 3 is an explanatory drawing of Comparative Example 1.
Figure 4:
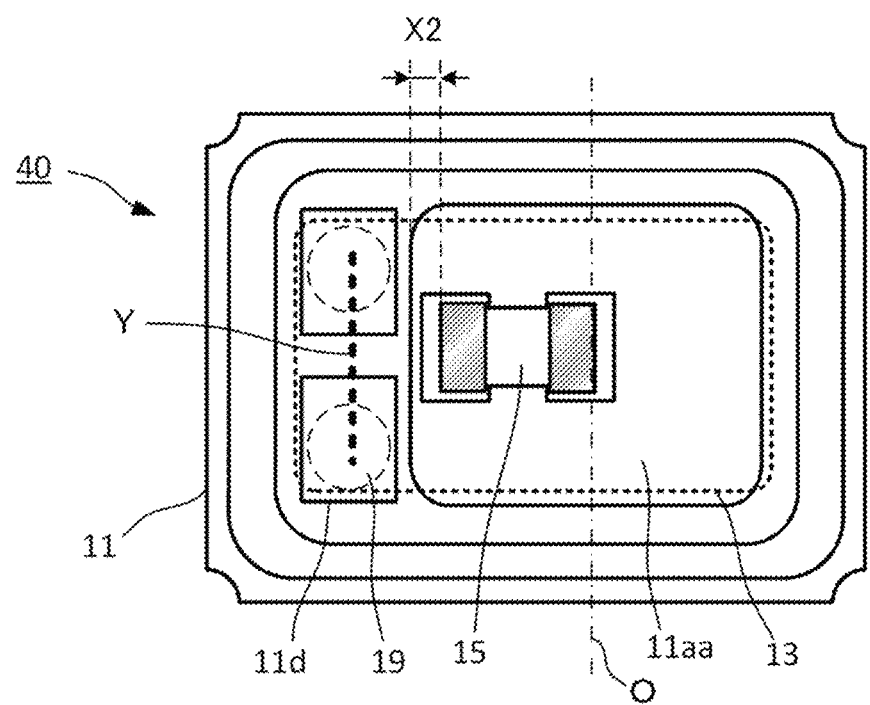
FIG. 4 is an explanatory drawing of Comparative Example 2.
Figure 5:
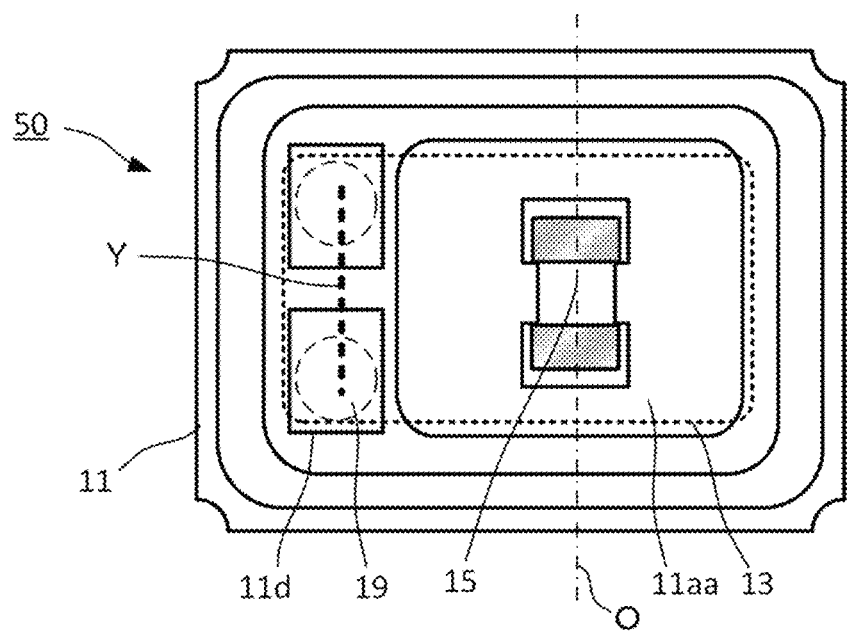
FIG. 5 is an explanatory drawing of Comparative Example 3.
Figure 6:
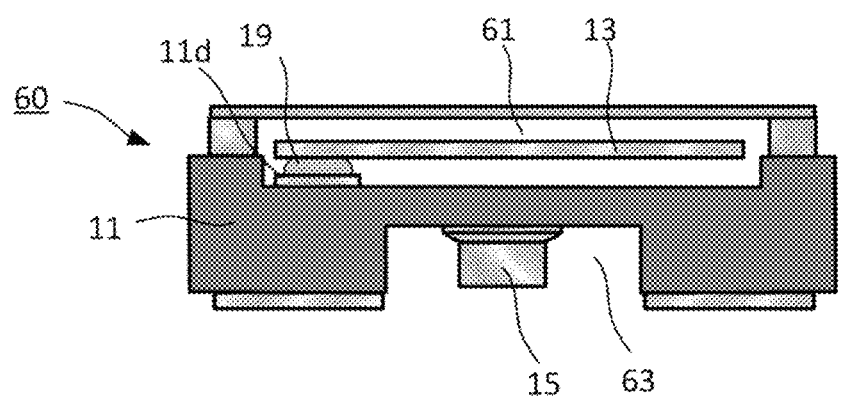
FIG. 6 is an explanatory drawing of Comparative Example 4.

Here, FIG. 3 is a drawing describing a crystal unit 30 of Comparative Example 1, FIG. 4 is a drawing describing a crystal unit 40 of Comparative Example 2, FIG. 5 is a drawing describing a crystal unit 50 of Comparative Example 3, and FIG. 6 is a drawing describing a crystal unit 60 of Comparative Example 4. FIGS. 3, 4, and 5 are top views similar to FIG. 1A illustrating corresponding crystal units 30, 40, and 50 of Comparative Examples. FIG. 6 is a sectional drawing similar to FIG. 1B illustrating the crystal unit 60 of Comparative Example 4.

The crystal unit 30 of Comparative Example 1 illustrated in FIG. 3 includes the temperature sensor 15 mounted in the container 11 so as to have a longitudinal direction perpendicular to the line segment Y and so as to be positioned on the center of the depressed portion 11aa of the container 11.

The crystal unit 40 of Comparative Example 2 illustrated in FIG. 4 includes the temperature sensor 15 mounted in the container 11 so as to have the longitudinal direction perpendicular to the line segment Y and so as to be approached to the edge of the depressed portion 11aa on the support pad 11d side. That is, the temperature sensor 15 is approached to the edge of the depressed portion 11aa on the support pad 11d side compared with the temperature sensor 15 of Comparative Example 1. A distance X2 between the edge of the temperature sensor 15 on the support pad 11d side and the edge of the depressed portion 11aa on the support pad 11d side is configured to be identical to a value in the case of Working Examples. Therefore, Comparative Example 2 has a level where the temperature sensor 15 is rotated by 90 degrees and approached to the support pad 11d side compared with the temperature sensors 15 of Working Examples.

The crystal unit 50 of Comparative Example 3 illustrated in FIG. 5 includes the temperature sensor 15 mounted in the container 11 so as to have the longitudinal direction parallel to the line segment Y and so as to be positioned on the center of the depressed portion 11aa of the container 11. That is, Comparative Example 3 has a level where the temperature sensor 15 is disposed far from the support pad 11d compared with the temperature sensors 15 of Working Examples.

The crystal unit 60 of Comparative Example 4 illustrated in FIG. 6 is what is called an H-shaped-structure temperature-sensor-provided crystal unit. That is, the crystal unit 60 has a structure where a chamber 61 housing the quartz-crystal vibrating piece 13 and a chamber 63 housing the temperature sensor 15 are separately disposed and these chambers are stacked. The temperature sensor 15 is mounted at the center in the chamber 63, that is, a position at the center on a plane of the container 11 as well.

Figure 7:
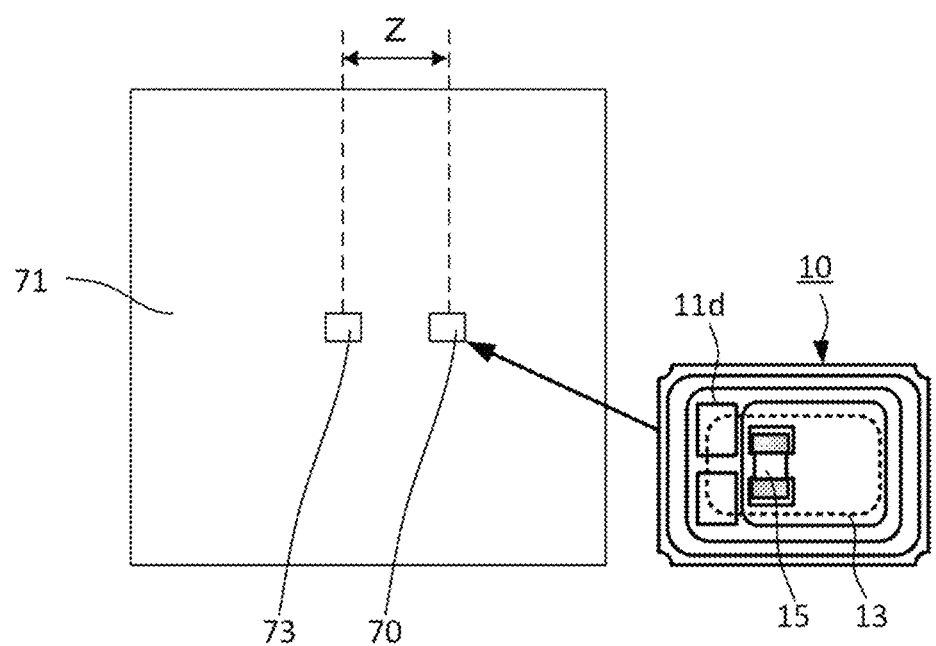
FIG. 7 is a drawing describing a simulation condition.

Next, as illustrated in FIG. 7, with a model where a model 70 for the simulations of Working Examples 1 and 2 and respective Comparative Examples and a heat source 73 are disposed on a base plate 71 with a predetermined distance Z, transmission conditions of a heat from the heat source 73 to the quartz-crystal vibrating piece 13 and the temperature sensor 15 in the model 70, that is, thermal response characteristics were simulated. Note that, as illustrated in FIG. 7, the simulations in this case were performed in a state where the heat source 73 is positioned on the securing portion 11d side of the crystal unit.

The simulations were performed under a condition where the crystal unit 10 had a 2520 size (long side dimension about 2.5 mm, short side dimension about 2 mm), the dimension of the depressed portion 11aa in the direction along the line segment Y was about 1.5 mm, the dimension in the direction perpendicular to the line segment Y was about 1.4 mm, and the temperature sensor 15 had a long dimension about 0.6 mm, a short dimension about 0.3 mm, and a thickness of 0.15 mm.

With the H-shaped-structure temperature-sensor-provided crystal units 80 and 60, the simulations were performed under a condition where the dimensions of the second chambers 81b and the chamber 63 in the direction along the line segment Y were about 1.4 mm, and the dimensions in the direction perpendicular to the line segment Y were about 0.9 mm.

Figure 8:
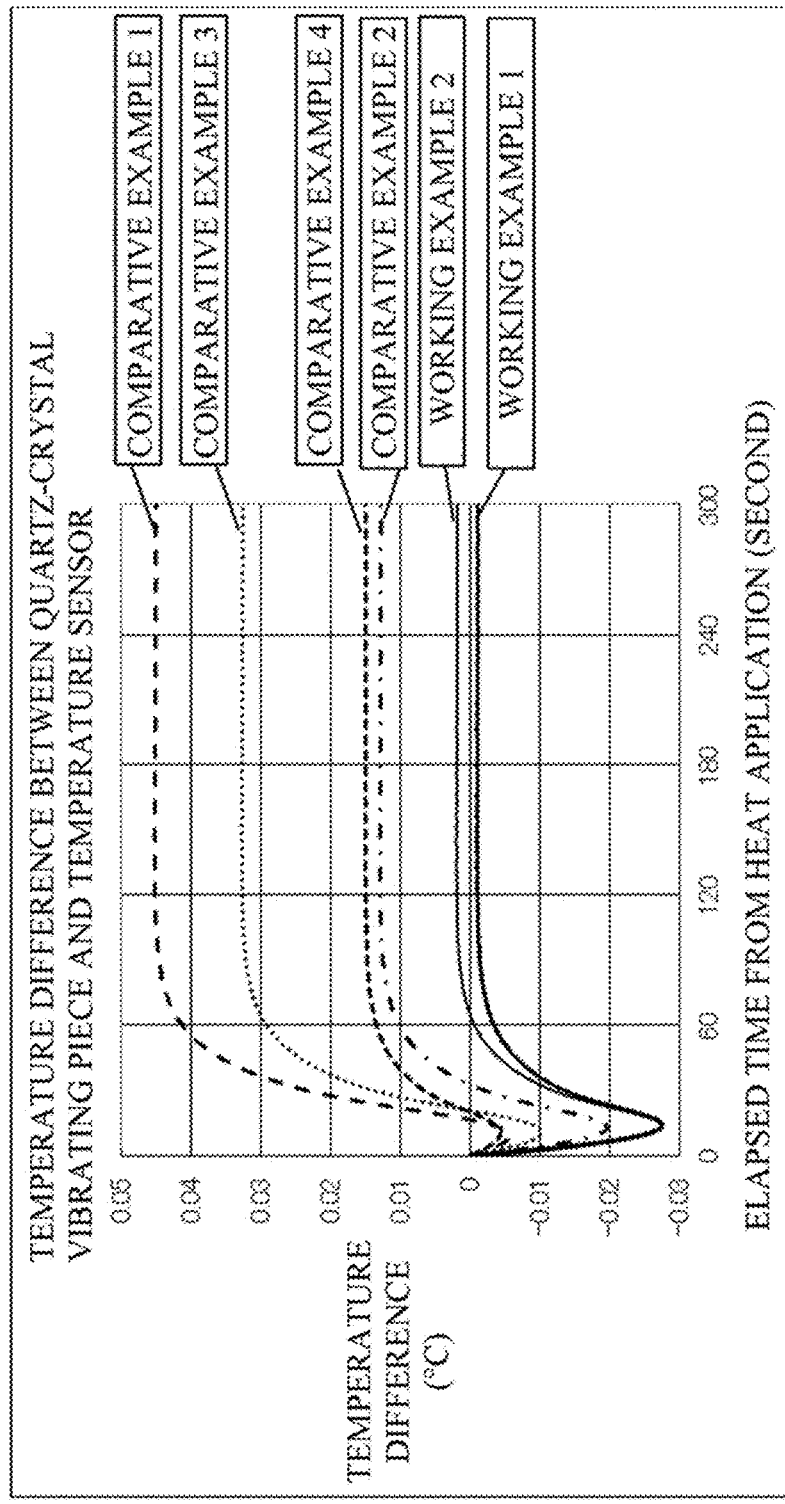
FIG. 8 is a drawing illustrating simulation results of thermal response characteristics of respective structures of Working Example 1, Working Example 2, Comparative Example 1, Comparative Example 2, Comparative Example 3, and Comparative Example 4.

FIG. 8 illustrates simulation results of the above-described thermal response characteristics, and a vertical axis takes a temperature difference between the quartz-crystal vibrating piece and the temperature sensor, and a horizontal axis takes an elapsed time from a time of turning the heat source ON.

In any case of the models, the temperature of the temperature sensor is higher than the temperature of the quartz-crystal vibrating piece immediately after turning the heat source ON, and the temperature difference between both indicates −0.001 to −0.003° C., while the temperature difference turns to a positive side with a time passage. Then, it is seen that in any model, the temperature difference stabilizes at each value after passing approximately 70 seconds since turning the heat source ON.

Note that, it is seen that the model where the temperature difference stabilizes at a minimum value, that is, the model where the temperature difference stabilizes at a value closest to zero is the model of Working Example 1. The model having the next small temperature difference is the model of Working Example 2. Then, the respective levels are indicated in a descending order of the temperature difference at a time where the temperature difference stabilized: Working Example 1<Working Example 2<Comparative Example 2<Comparative Example 4<Comparative Example 3<Comparative Example 1.

Accordingly, it can be understood that an arrangement structure of the temperature sensor according to this disclosure can decrease the difference between the temperature of the quartz-crystal vibrating piece and the temperature of the temperature sensor.

<Other Simulation Result>

The following simulation was performed as another simulation.

Figure 9:
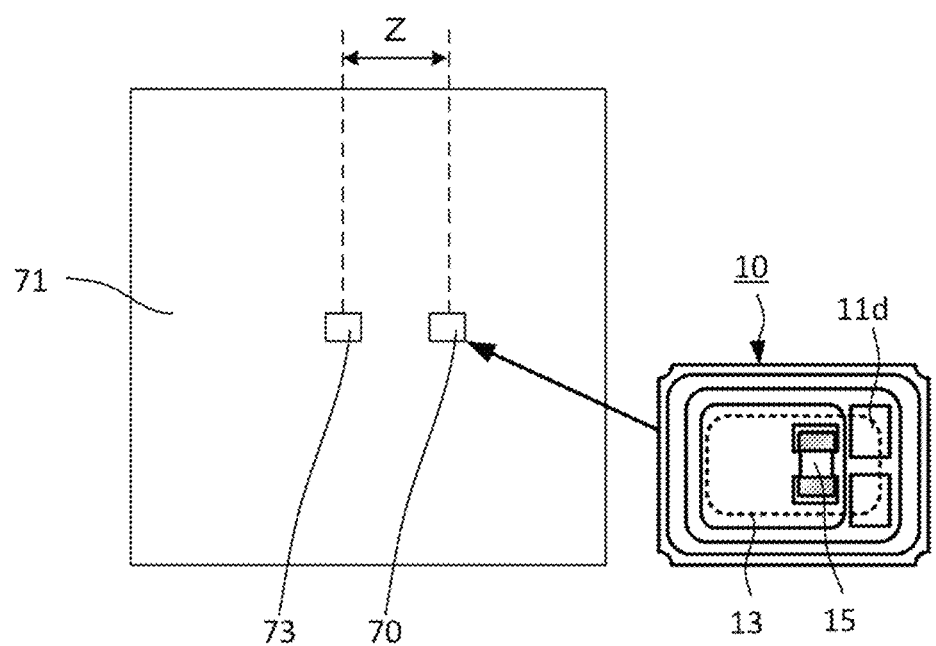
FIG. 9 is a drawing describing an arrangement relationship when a positional relationship between a heat source and a crystal unit is changed.

That is, a simulation was performed to find a trend of the temperature difference between the quartz-crystal vibrating piece and the temperature sensor on a case where the distance S was changed in the model of Working Example 1 illustrated in FIG. 1A to FIG. 1C and a case where the distance S was changed in the model of Comparative Example 2 illustrated in FIG. 4. Note that, this simulation was performed on a case where the heat source 73 was positioned on the securing portion 11d side of the crystal unit (a state of FIG. 7) and a case where the heat source 73 was positioned on a side of a distal end of the quartz-crystal vibrating piece 13 of the crystal unit (see FIG. 9).

Figure 10A:
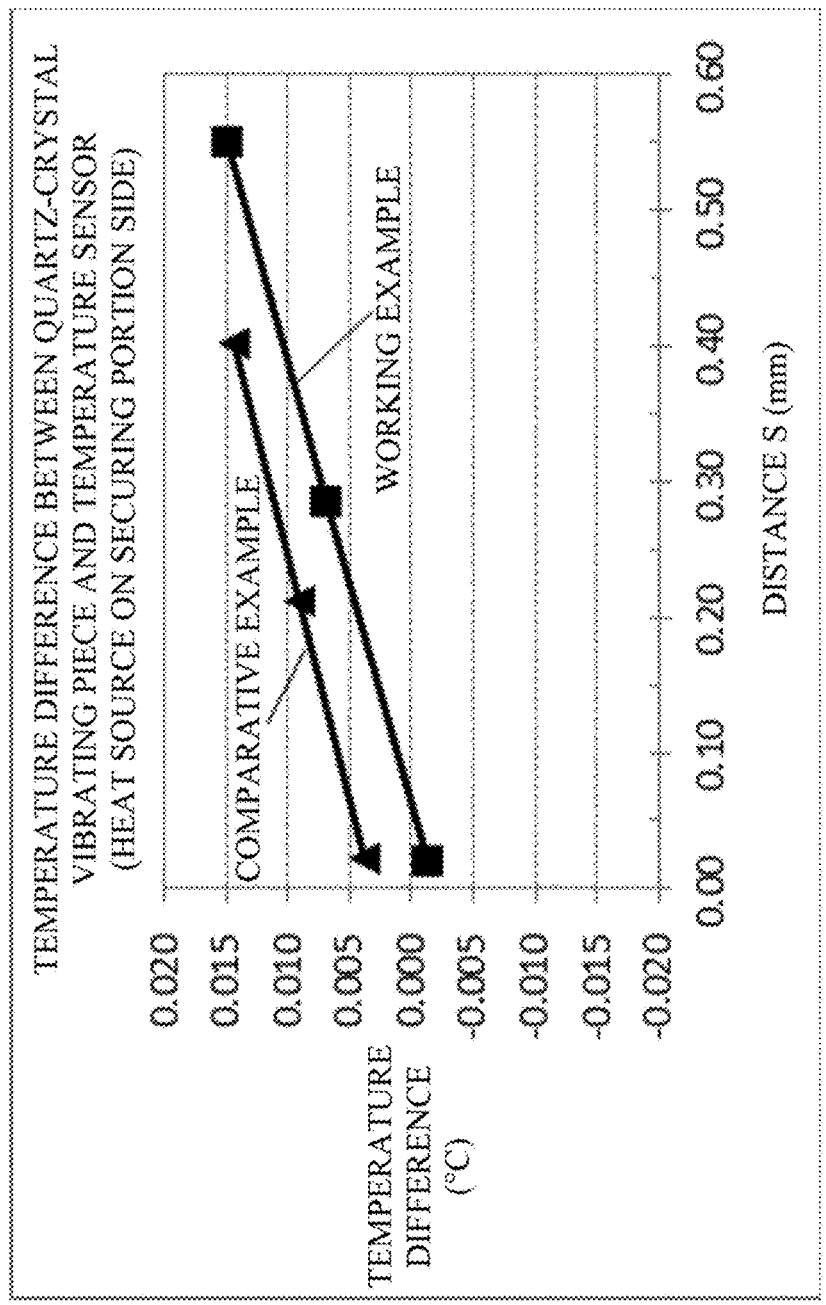
FIG. 10A and FIG. 10B are drawings describing results of simulations performed by changing a distance S and an arrangement of the heat source and the crystal unit in models of Working Example and Comparative Example.
Figure 10B:
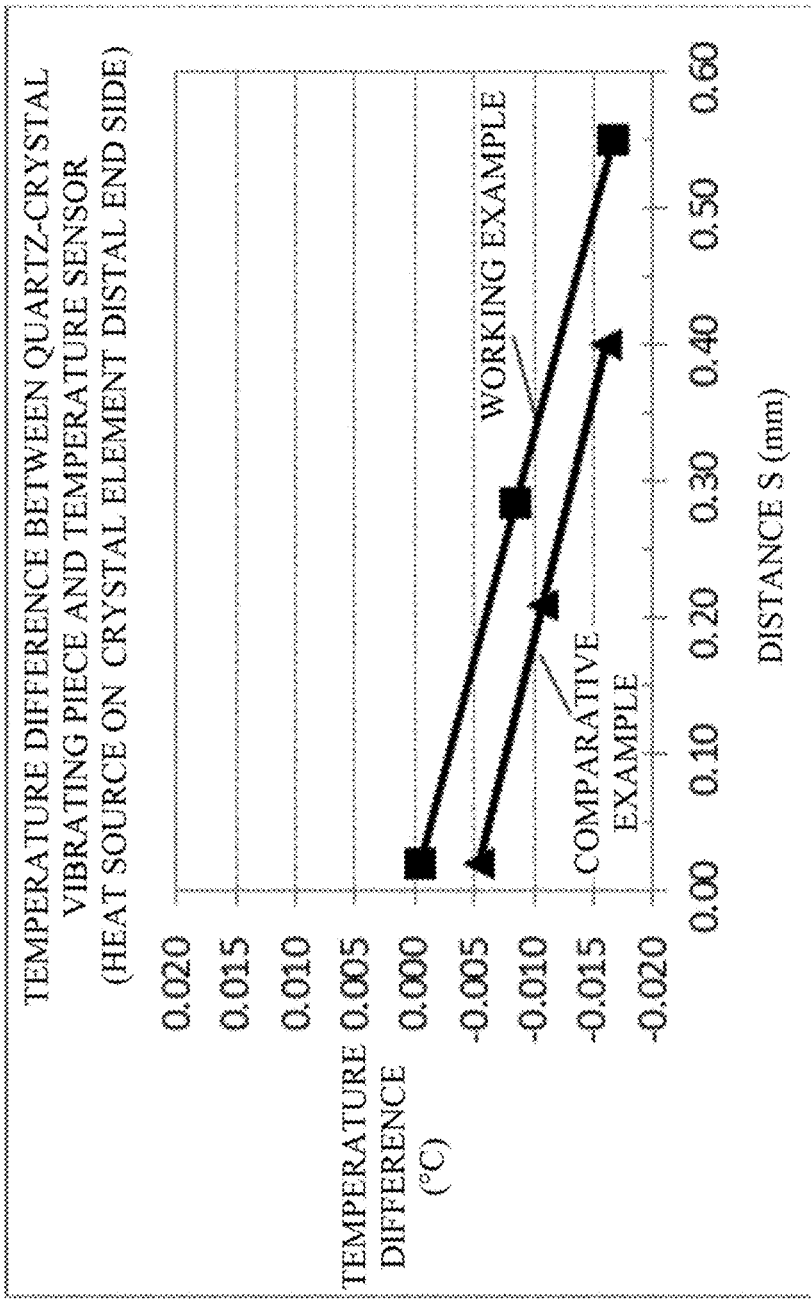

FIG. 10A and FIG. 10B illustrate results of these simulations. In both FIG. 10A and FIG. 10B, the horizontal axis takes the above-described distance S, and the vertical axis takes the temperature difference between the quartz-crystal vibrating piece and the temperature sensor, the temperature difference when the temperature difference stabilized, specifically, the temperature difference after the elapsed time of 120 seconds in FIG. 8.

FIG. 10A and FIG. 10B indicate that the temperature difference between the quartz-crystal vibrating piece and the temperature sensor decreases as the distance S decreases in both cases of Working Example 1 and Comparative Example 2. Note that, it is seen that the temperature difference between the quartz-crystal vibrating piece and the temperature sensor is small at any distance S in Working Example 1 compared with Comparative Example 2. Moreover, it is seen that regardless of whether the heat source is disposed on the securing portion 11d side of the crystal unit or the distal end side of the quartz-crystal vibrating piece, the temperature difference between the quartz-crystal vibrating piece and the temperature sensor is small at any distance S in Working Example 1 compared with Comparative Example 2.

Accordingly, it can be understood that the arrangement of the temperature sensor described in this disclosure is preferred arrangement as an arrangement to decrease the temperature difference between the quartz-crystal vibrating piece and the temperature sensor.

This simulation was performed assuming what is called a thermistor in 0603 size as the temperature sensor. Therefore, in FIG. 10A and FIG. 10B, a position on the horizontal axis where the distance S is 0.3 mm is a position of the short dimension of the temperature sensor, a position at the distance S of 0.225 mm is a position of 75% of the short dimension of the temperature sensor, and a position at the distance S of 0.15 mm is a position of 50% of the short dimension of the temperature sensor. As described above, the smaller distance S is more preferable. However, considering a mounting accuracy of a temperature sensor mounting apparatus (for example, approximately ±30 μm in an exemplary current technique) and an amount desired to decrease the temperature difference between the quartz-crystal vibrating piece and the temperature sensor, the distance S is preferred to be selected from values equal to or less than the short dimension of the temperature sensor, preferably values equal to or less than 75% of the short dimension of the temperature sensor, and more preferably, values equal to or less than 50% of the short dimension of the temperature sensor.

3. Other Embodiment

While the embodiments of this disclosure have been described above, this disclosure is not limited to the above-described examples. While the example where the thermistor is used as the temperature sensor has been described above, the temperature sensor is not limited to the thermistor. As the temperature sensor, various devices having a temperature sensing function may be used including a device using a PN junction of a semiconductor (specifically, a diode or a transistor).

While the example where the container for the seam welding is used as the container has been described above, this should not be construed in a limiting sense. Other containers, for example, a container sealed with what is called an alloy of gold and tin and similar alloy, and a container sealed by a sealing method what is called a direct seam may be employed. The structure of the chamber 11a and the structure of the depressed portion 11aa of the container 11 are not limited to the above-described example. While the single-chamber-type temperature-sensor-provided crystal unit having 2520 size has been described as an example in the above description, this disclosure is also applicable to the crystal unit having the other size.

To embody the first aspect, preferably, the single-chamber-type temperature-sensor-provided crystal unit further includes a depressed portion configured to house the temperature sensor on a bottom surface in the single chamber, the depressed portion having a square planar shape, and the temperature sensor is disposed to be close to the two securing portions side within the depressed portion.

To embody the first aspect, a distance S is preferred to be equal to or less than a width dimension of the temperature sensor, preferably equal to or less than 75% of the width dimension of the temperature sensor, further preferably equal to or less than 50% of the width dimension of the temperature sensor, when a distance between an edge of the depressed portion, on which the temperature sensor is mounted, on the securing portion side and an edge of the temperature sensor on the securing portion side is defined as the distance S. Thus configured distance S causes a heat from the securing portion side to be easily transferred to the temperature sensor. The smaller distance S is more preferable. Specifically, the smaller distance S is more preferable within a range where an interference, for example, an electrical contact of the temperature sensor to the quartz-crystal vibrating piece securing portion, does not occur. The minimum value of the distance S is preferred to be determined in consideration of, for example, a mounting accuracy of a temperature sensor mounting apparatus.

According to a second aspect of the disclosure, there is provided a crystal unit, which is an H-shaped-structure temperature-sensor-provided crystal unit, and includes: a first chamber that houses a quartz-crystal vibrating piece, a second chamber stacked over the first chamber, the second chamber housing the temperature sensor, the quartz-crystal vibrating piece mounted in the first chamber, and the temperature sensor mounted in the second chamber. The quartz-crystal vibrating piece has a square planar shape. The quartz-crystal vibrating piece is secured in the first chamber at two positions via conductive members, the two positions being in proximities of both ends of a first side of the quartz-crystal vibrating piece. The temperature sensor has a rectangular parallelepiped shape. The temperature sensor is disposed within the second chamber such that a longitudinal surface of the temperature sensor is parallel to a line segment Y and the temperature sensor is close to the two securing portions side in the first chamber, when a line segment connecting the two securing portions is defined as the line segment Y.

To embody the second aspect, preferably, a distance S is preferred to be equal to or less than a width dimension of the temperature sensor, preferably equal to or less than 75% of the width dimension of the temperature sensor, further preferably equal to or less than 50% of the width dimension of the temperature sensor, when a distance between an edge of the second chamber, on which the temperature sensor is mounted, on the securing portion side and an edge of the temperature sensor on the securing portion side is defined as the distance S. Thus configured distance S causes a heat from the securing portion side to be easily transferred to the temperature sensor. The smaller distance S is more preferable. Specifically, the smaller distance S is more preferable within a range where an interference, for example, an electrical contact of the temperature sensor to the quartz-crystal vibrating piece securing portion, does not occur. The minimum value of the distance S is preferred to be determined in consideration of, for example, a mounting accuracy of a temperature sensor mounting apparatus.

In the first and second aspects, parallel to the line segment Y includes a case of approximately parallel within range of an object of the disclosure. For example, a case of slightly non-parallel caused by, for example, the position accuracy of the temperature sensor mounting apparatus is included in the disclosure.

According to the single-chamber-type temperature-sensor-provided crystal unit and the H-shaped-structure temperature-sensor-provided crystal unit of this disclosure, the longitudinal surface of the rectangular parallelepiped temperature sensor faces the two securing portions of the quartz-crystal vibrating piece, moreover, closely faces. Consequently, a surface having a largest area among six surfaces of the rectangular parallelepiped temperature sensor closely faces the two securing portions of the quartz-crystal vibrating piece. Generally, the quartz-crystal vibrating piece is connected to a wiring pad or the like in the chamber with the conductive adhesive. The heat from the outside of the crystal unit is transferred to the quartz-crystal vibrating piece mainly via the mounting terminal of the crystal unit and the above-described conductive adhesive. In such a case, the temperature sensor disposed on the predetermined position as the structure of this disclosure ensures efficiently transmitting the external heat to the temperature sensor similarly to the case of the quartz-crystal vibrating piece compared with the temperature sensor disposed in other manners. In view of this, in the realistic structure, the temperature difference between the quartz-crystal vibrating piece and the temperature sensor can be decreased compared with the conventional temperature difference.

The principles, preferred embodiment and mode of operation of the present disclosure have been described in the foregoing specification. However, the disclosure which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present disclosure. Accordingly, it is expressly intended that all such variations, changes and equivalents which fall within the spirit and scope of the present disclosure as defined in the claims, be embraced thereby.

What is claimed is:

1. A crystal unit, which is a single-chamber-type temperature-sensor-provided crystal unit, and the crystal unit comprising:
    a single chamber; and
    a quartz-crystal vibrating piece and a temperature sensor, provided in the single chamber,
    wherein
    the quartz-crystal vibrating piece has a square planar shape,
    the quartz-crystal vibrating piece is secured in the single chamber at two securing portions via conductive members, the two securing portions being in proximities of both ends of a first side of the quartz-crystal vibrating piece,
    the temperature sensor has a rectangular parallelepiped shape, and
    the temperature sensor is disposed such that a longitudinal surface of the temperature sensor is parallel to a line segment Y and the temperature sensor is close to a side of the two securing portions within the single chamber, when a line segment connecting the two securing portions is defined as the line segment Y;
    wherein the crystal unit further comprises:
        a depressed portion, configured to house the temperature sensor on a bottom surface of the single chamber, the depressed portion having a square planar shape,
        wherein the temperature sensor is disposed to be close to the side of the two securing portions within the depressed portion.

2. The crystal unit according to claim 1, wherein
    a distance S is equal to or less than a short side dimension of the temperature sensor, when a distance between an edge of the depressed portion on the side of the two securing portions and an edge of the temperature sensor on the side of the two securing portions is defined as the distance S.

3. The crystal unit according to claim 1, wherein
    a distance S is equal to or less than 75% of a short side dimension of the temperature sensor, when a distance between an edge of the depressed portion on the side of the two securing portions and an edge of the temperature sensor on the side of the two securing portions is defined as the distance S.

4. The crystal unit according to claim 1, wherein
    a distance S is equal to or less than 50% of a short side dimension of the temperature sensor, when a distance between an edge of the depressed portion on the side of the two securing portions and an edge of the temperature sensor on the side of the two securing portions is defined as the distance S.

5. A crystal unit, which is an H-shaped-structure temperature-sensor-provided crystal unit, and the crystal unit comprising:
    a quartz-crystal vibrating piece;
    a first chamber that houses the quartz-crystal vibrating piece;
    a temperature sensor; and
    a second chamber, housing the temperature sensor, and the second chamber being stacked with the first chamber,
    wherein
    the quartz-crystal vibrating piece is mounted in the first chamber,
    the temperature sensor is mounted in the second chamber,
    the quartz-crystal vibrating piece has a square planar shape,
    the quartz-crystal vibrating piece is secured in the first chamber at two securing portions via conductive members, the two securing portions being in proximities of both ends of a first side of the quartz-crystal vibrating piece,
    the temperature sensor has a rectangular parallelepiped shape, and
    the temperature sensor is disposed within the second chamber such that a longitudinal surface of the temperature sensor is parallel to a line segment Y and the temperature sensor is close to a side of the two securing portions in the first chamber, when a line segment connecting the two securing portions is defined as the line segment Y.

6. The crystal unit according to claim 5, wherein
    a distance S is equal to or less than a short side dimension of the temperature sensor, when a distance between an edge of the second chamber on the side of the two securing portions and an edge of the temperature sensor on the side of the two securing portions is defined as the distance S.

7. The crystal unit according to claim 5, wherein
a distance S is equal to or less than 75% of a short side dimension of the temperature sensor, when a distance between an edge of the second chamber on the side of the two securing portions and an edge of the temperature sensor on the side of the two securing portions is defined as the distance S.

8. The crystal unit according to claim 5, wherein
a distance S is equal to or less than 50% of a short side dimension of the temperature sensor, when a distance between an edge of the second chamber on the side of the two securing portions and an edge of the temperature sensor on the side of the two securing portions is defined as the distance S.

\* \* \* \* \*